United States Patent [19]

Takahashi

[11] Patent Number: 4,810,864

[45] Date of Patent: Mar. 7, 1989

[54] MEMORY CARD HAVING IMPROVED DATA PROTECTION

[75] Inventor: Kaoru Takahashi, Tokyo, Japan

[73] Assignee: Seiko Instruments Inc., Tokyo, Japan

[21] Appl. No.: 112,387

[22] Filed: Oct. 22, 1987

[30] Foreign Application Priority Data

Nov. 7, 1986 [JP] Japan .................. 61-265226

[51] Int. Cl.$^4$ .................... G06K 19/00; H02H 3/20
[52] U.S. Cl. .................. 235/487; 235/380; 361/91
[58] Field of Search ........... 235/487, 380, 381, 492, 235/441; 361/111, 91, 57, 58, 54, 56

[56] References Cited

U.S. PATENT DOCUMENTS

| | | | |
|---|---|---|---|
| 4,004,133 | 1/1977 | Hannan et al. | 235/487 X |
| 4,272,758 | 6/1981 | Giraud | 235/380 X |
| 4,506,148 | 3/1985 | Berthold et al. | 235/380 |
| 4,521,679 | 6/1985 | Anderson | 235/380 X |
| 4,645,914 | 2/1987 | Hiraishi | 235/382 X |
| 4,692,601 | 9/1987 | Nakano | 235/487 X |

FOREIGN PATENT DOCUMENTS

| | | | |
|---|---|---|---|
| 120287 | 6/1986 | Japan | 235/487 |
| 150088 | 7/1986 | Japan | 235/487 |

Primary Examiner—M. H. Paschall
Assistant Examiner—A. Jonathan Wysocki
Attorney, Agent, or Firm—Spensley Horn Jubas & Lubitz

[57] ABSTRACT

A memory card for storing information having a shape similar to that of a credit card. The memory card includes a capacitor connected across power terminals of a RAM and a resistor connected between one power terminal of the RAM and an external terminal. A switch is connected in parallel with the resistor for short-circuiting the resistor. The switch is controlled in accordance with a signal from an external device. When the RAM is accessed by the external device, the switch is closed so that the impedance of the power supply line is decreased.

3 Claims, 2 Drawing Sheets

MEMORY CARD HAVING IMPROVED DATA PROTECTION

BACKGROUND OF THE INVENTION

1. Field of the Invention

The present invention generally relates to a memory card having a size similar to that of credit card and being capable of storing a great deal of information therein and more particularly memory card having a random access memory and power supply therein.

2. Prior Art

Generally, a 3 Volt lithium battery is used in a memory card having a RAM. A power source for the main body (that portion of a system which can contain the memory card but excludes the memory card) is often 5 Volt to drive a CPU and various control circuitries. Thus the moment the memory card is inserted into the main body, the voltage of the power source for the RAM in the memory card abruptly changes from 3 Volt to 5 Volt to thereby often destroy a part or all of the data stored in the RAM. The prior art measure to prevent this event will be described using FIG. 2 which is a circuit diagram of an embodiment of a prior art memory card. In FIG. 2, memory card 20 is generally constituted by a RAM 21, a 3 Volt battery 22, a resistor 23 and capacitor 24 to prevent the data destruction. A diode 25 is for prevention of reverse flow. When the memory card 20 is inserted the main body, power source lines, address lines 201 (A0–An), data lines 202 (D0–Dn), control lines 203 (chip enable, etc.,) are connected electrically with the circuitries in the main body. At this time the RAM power source voltage slowly rises up from 3 volt to 5 Volt with a time constant of resistor 23 and capacitor 24. If a fluctuation of the RAM power source voltage is slow with a time constant more than 1 msec. (1/1000 seconds), it is said that data destruction can be prevented, which is actually ascertained experimentally. Thus the prior art prevents destruction of the data stored in the RAM by inserting a resistor and capacitor in circuit of the power source line for the memory card.

However, a problem with the prior art memory card having the above structure is that the values of a resistor and a capacitor to render the time constant of the RAM power source fluctuation larger than 1 msec are limited to values to be described hereinafter. If the capacity of the capacitor is increased, its volume also increases, so that the memory card which is required to be thin limits the capacity of the capacitor 24 to less than about 1 μF. As a result the value of resistance of resistor 23 is required to be more than about 1K, and the impedance of the power supply line increases. The RAM has a cell structure as shown in FIG. 3. When the RAM is accessed to, a switch 211 opens, and electric current flow through a road transistor 212 and a transistor 213 within the cell in the direction of the arrow 214. A sense amplifier and a decoder also are enable. Total current during the access to the RAM is generally around 30 to 40 mA. As a described above, when the impedance of the power supply line is increased by inserting the resistor of more than 1K to the power supply line, voltage fall occurs at the inserted resistor by the current during access and voltage supplied to the RAM is below the operation voltage thereof. In order to prevent this problem, the value of resistance of the inserted resistor have to be small. Namely, since the value of the resistor and capacitor are limited, it is very difficult to obtain a time constant larger than 1 msec.

Furthermore the capacitor is charged via a protective diode within the RAM from various signal lines depending on the state of the address lines, data line, control lines (chip enable, etc.) on the side of the main body, so that a desired time constant cannot be obtained.

SUMMARY OF THE INVENTION

It is therefore an object of the present invention to provide an memory card which is very thin.

It is another object of the present invention to provide an memory card having very high reliability.

It is a further object of the present invention to provide an memory card without destruction of data occurring due to the fluctuation of voltage of the power source of the RAM when a memory card is inserted into the main body.

It is a yet further object of the present invention to provide an memory card having the time constant lager than 1 msec for the fluctuation of voltage of the power source of the RAM.

An memory card having a shape similar to credit card for storing information comprises memory means for storing information having a plurality of terminals for receiving information from and outputting information stored therein to said external device and two power terminals, power supply means in said memory card connected to said two power terminals of said memory means for energizing said memory means, a plurality of external terminals connected to said plurality of terminals of memory means for electrically connecting sais memort means terminals of external device, two external power terminal connected said power terminals respectively for electrically connecting said power terminals of memory means and an external power source having a voltage differ from a voltage of said power supply means in said memory card, capacitor connected across said power terminals of said memory means, resistor connected across one of said external power terminal and one of said power terminal of said memory means, switching means for short-circuiting said resistor in accordance with a signal from outside.

These and other objects of the invention will become apparent and obvious to those skilled in the pertinent art upon referring to the following description provided in connection with the accompanying drawings, of which:

DESCRIPTION OF PREFERRED EMBODIMENT

Figure 1:
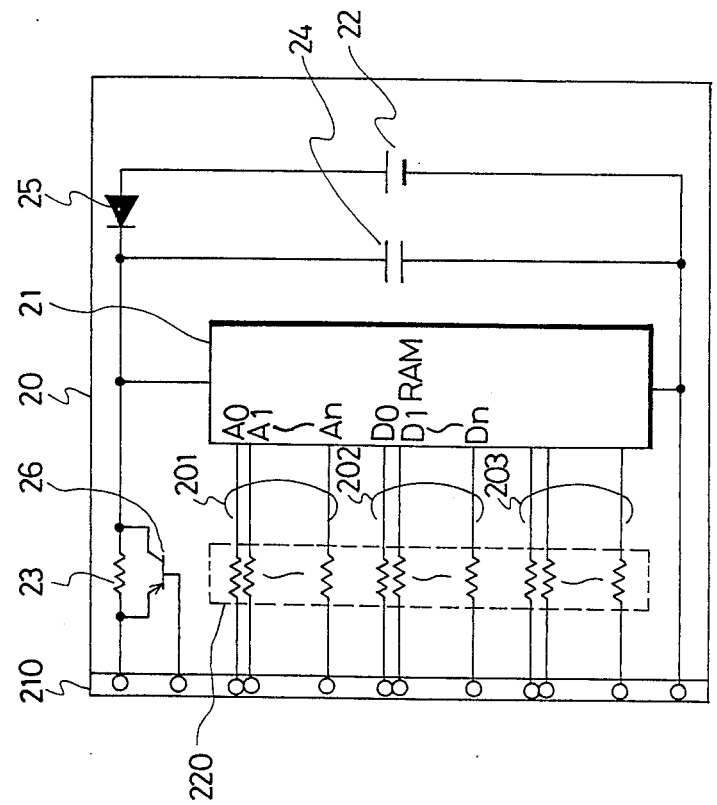
FIG. 1 is a circuit diagram of an embodiment of a memory card according to this invention.
Figure 3:
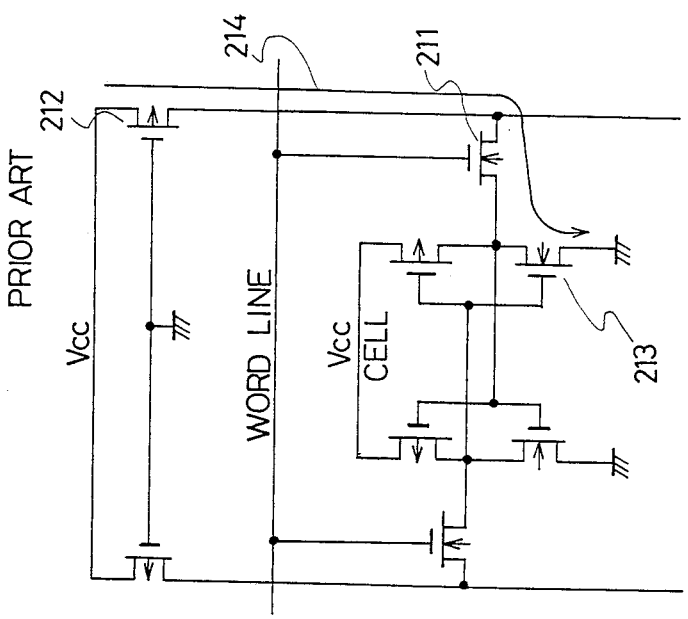
FIG. 3 is a circuit diagram of an example of a cell in the RAM.
Figure 2:
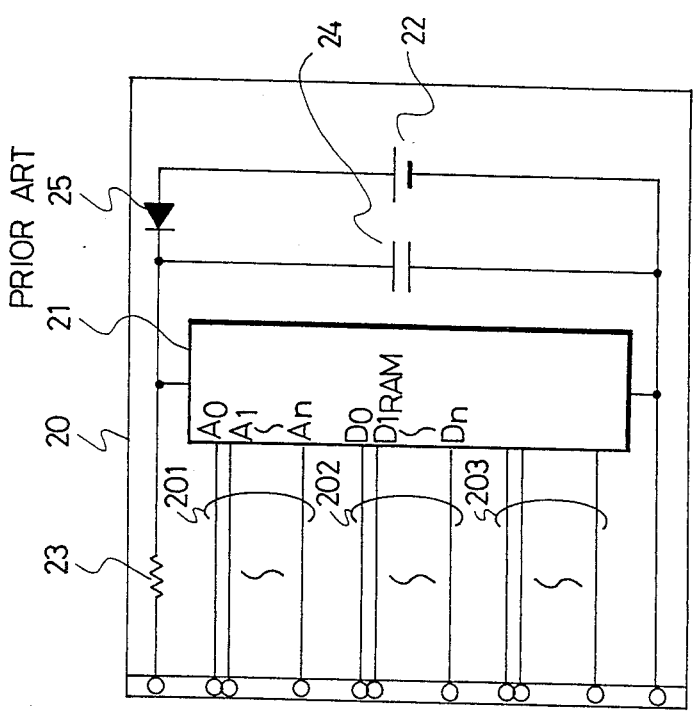
FIG. 2 is a circuit diagram of an example of a memory card according to the prior art.

FIG. 1 is a circuit diagram for an embodiment of a memory card according to this invention. Memory card 20 includes a RAM 21 which stores information, a battery 22, a reverse flow preventive diode 25, a capacitor 24 across a power source for RAM 21, and a resistor 23 connected across the RAM 21 power source and an external terminal 210. As switching means for short-circuiting resistor 23 connects the emitter and collector of transistor 26 and an external terminal 210 connected to the base of transistor 26. Resistors 220 are connected in series across external terminals and corresponding addresses lines 201, data lines 202, control lines 203 (chip enable, etc.). When memory card 20 is inserted into the main body, the power source voltage for RAM 21 starts to rise from 3 Volt to 5 Volt, provided that battery 22 is of 3 Volt and the power source voltage for the main body is of 5 Volt. At this time, the base terminal of transistor 26 is connected via external terminal 210 to the main body. The base terminal is connected to a signal which change to "L" level within the main body when the RAM is accessed. Namely, the base terminal of transistor 26 is at "H" level by a signal from the inside of the main body and transistor 26 is off. Therefore, the power source voltage of RAM 21 slowly rises up with a time constant of resistor 23 and capacitor 24. On the other hand, when the RAM is accessed, the base terminal of transistor 26 is turned off. Therefore, when the RAM is accessed, the power source impedance can be reduced to sufficiently low value, so that the value of resistor 23 can be selected to provide a necessary time constant. Control of transistor 26 can easily be realized using a control signal (chip enable, etc.) to the RAM without addition of a special circuitry.

If any one of the address lines, data lines, and control lines of the main body is at "H" level when memory card 20 is inserted into the main body, capacitor 24 will be changed via the protective diode within RAM 21 to thereby raise the power source voltage of RAM 21. However, resistors 220 are connected in series to the respective signal lines, so that the power source voltage of RAM 21 slowly rises up on the basis of a time constant of resistor 220 and capacitor 24. These resistors 220 can be selected to have values which access to the RAM is hindered.

As described above, this invention employs a circuitry in which the value of resistor 23 can be increased although the capacity of capacitor 24 can be small, so that a time constant larger than 1 msec can easily be obtained. Resistors 220 inserted in series in circuit of the respective signal lines provide desired time constants although the signal lines at the main body may be at any levels.

While the invention has been shown and described with reference to the preferred embodiment thereof, it will be understood by those skilled in the art that the other changes inform and detail may spirit and scope of the invention.

What is claimed is:

1. A memory card having a shape similar to a credit card for storing information, said memory card being connectable to an external device which has a power source for supplying power at a given voltage, said memory card comprising:
    memory means for storing information and having two internal power terminals for supplying power to said memory means and a plurality of internal information terminals for receiving and outputting information signals;
    power supply means connected to said internal power terminals for supplying power to said memory means at a voltage different from the given voltage;
    a plurality of external information terminals connected to said internal information terminals for electrically connecting said memory means to the external device;
    two external power terminals;
    means connected said external power terminals to said internal power terminals for electrically connecting said internal power terminals to the power source of the external device, said means including a resistor connected in series between one of said external power terminals and one of said internal power terminals;
    a capacitor connected between said internal power terminals; and
    switching means connectable to the external device to be actuated by a signal from the external device and connected to said resistor for short-circuiting said resistor in response to such signal.

2. A memory card as claimed in claim 1, wherein the values of said resistor and capacitor are selected so that the time constant constituted by said resistor and capacitor is larger than 1 msec.

3. A memory card as claimed in claim 1 further comprising a plurality of further resistors each connected between a respective one of said plurality of external information terminals and a respective one of said plurality of internal information terminals.

* * * * *